United States Patent [19]

Takahashi et al.

[11] Patent Number: 5,021,701

[45] Date of Patent: Jun. 4, 1991

[54] PIEZOELECTRIC VIBRATOR MOUNTING SYSTEM FOR A NEBULIZER

[75] Inventors: Minoru Takahashi; Tsutomu Kotani; Shinichi Endo, all of Chiba, Japan

[73] Assignee: TDK Corporation, Tokyo, Japan

[21] Appl. No.: 421,069

[22] Filed: Oct. 13, 1989

[30] Foreign Application Priority Data

Oct. 20, 1988 [JP] Japan .......................... 63-136197[U]
Oct. 31, 1988 [JP] Japan .......................... 63-141000[U]
Oct. 31, 1988 [JP] Japan .......................... 63-141001[U]

[51] Int. Cl.[5] .......................................... H01L 41/08

[52] U.S. Cl. .................................. 310/345; 310/324; 239/102.2

[58] Field of Search .............................. 310/322-324, 310/348, 345; 239/102.2

[56] References Cited

U.S. PATENT DOCUMENTS 3,890,513 6/1975 Barleen et al. ...................... 310/324
3,937,991 2/1976 Massa et al. .................... 310/345 X
4,013,992 3/1977 Dewberry et al. ............ 310/345 X
4,190,783 2/1980 Massa ............................ 310/324 X
4,190,784 2/1980 Massa ................................ 310/324
4,230,383 10/1980 Burnstein et al. ............. 310/324 X
4,282,520 8/1981 Shipp et al. ...................... 310/324 X
4,420,706 12/1983 Siebold et al. ....................... 310/324
4,746,905 5/1988 Harima et al. .................. 310/348 X

FOREIGN PATENT DOCUMENTS 0210798 11/1984 Japan .................................. 310/332

*Primary Examiner*—Mark O. Budd
*Attorney, Agent, or Firm*—Martin M. Novack

[57] ABSTRACT

System for mounting a piezoelectric vibrator comprises an annular projected vibrator support (27) integrally formed with an insulating support (21), a piezoelectric vibrator (1) located on the annular vibrator support (27) and an elastic annular holder (22) having an essentially L-shaped section for holding down the periphery of the piezoelectric vibrator (1) fitted to the insulating support (21), a plurality of connecting electrode members (23,24) being mounted on the vibrator support (27) and each of the connecting electrode members (23,24) being pressed against the corresponding electrodes (2B,2A') of the piezoelectric vibrator (1).

8 Claims, 7 Drawing Sheets

PIEZOELECTRIC VIBRATOR MOUNTING SYSTEM FOR A NEBULIZER

BACKGROUND OF THE INVENTION

The present device relates to a piezoelectric vibrator mounting system for generating an ultrasonic wave by using a piezoelectric vibrator to atomize a liquid.

In general, a nebulizer utilizing the phenomenon that, when a ultrasonic wave is radiated from inside a liquid toward a liquid surface, a water column is formed thereon at a prescribed ultrasonic wave intensity or above, and, the liquid is atomized, is widely utilized as a room humidifier.

FIG. 1 shows a conventional piezoelectric vibrator mounting system for holding a piezoelectric vibrator used in such a liquid atomizer for generating the ultrasonic wave so as to be able to energize the piezoelectric vibrator. In FIG. 1, the piezoelectric vibrator 1 for generating the ultrasonic wave has a structure wherein an ultrasonic wave radiating electrode surface 2A provided on the surface of the piezoelectric vibrator 1, a marginal electrode 2A' formed on a peripheral portion on the rear surface and connected to said surface 2A and a counter electrode 2B are provided in the approximately central portion on the rear surface of the piezoelectric vibrator 1. The piezoelectric vibrator 1 is excited by a high frequency exciting circuit at a frequency of the range of 1∼3 MHz. The piezoelectric vibrator mounting system 10 comprises an outer casing 11 and an inner casing 12 both made of an insulating material, an elastic annular holder 13 made of a rubber or the like and having a U-shaped cross section, an annular electrode member 14 for contact with the marginal electrode 2A' and another electrode member 15 for contact with the counter electrode 2B.

The piezoelectric vibrator 1 has the annular electrode member 14 inserted into the groove 16 of the elastic annular holder 13 with the U-shaped cross section as superposed on the marginal electrode 2A' in close contact therewith. It is easy to atomize a liquid, so that the piezoelectric vibrator 1 is inclined for the horizontal level. It is able to keep its watertightness by the elastic annular holder 13 with the U-shaped cross section. Then, the elastic annular holder 13 is inserted into the inner casing 12 with a bottom surface superposed on the annular electrode member 15. After required lead wires are connected to the tongue-like portions 14A and 15A of the electrode members 14 and 15, respectively, which are penetrated through the slit-like openings 17 of the inner casing 12 down to the rear side thereof, the inner casing 12 is fixed to the outer casing 11 formed with lead wire leadout grooves 18 in advance.

Since the conventional piezoelectric vibrator mounting system shown in FIG. 1 has employed the elastic annular holder 13 with the U-shaped cross section, extremely troublesome handwork has been required for inserting the superposed piezoelectric vibrator 1 and the annular electrode member 14 into the groove 16 of the holder 13, which has reduced the efficency and effectiveness of an automated assembling process. Further, since the inner casing 12 has been provided separate from the outer casing 11, the number of parts and assembling man-hours have been apt to increase and subsequently manufacturing cost has been high.

SUMMARY OF THE INVENTION

It is an object, therefore, of the present invention to overcome the disadvantages and limitations of a prior mounting system by providing a new piezoelectric vibrator mounting system wherein the above-described drawbacks of the prior art are removed, and has a rational structure suitable for the automation of the assembling process that is easy to assemble and is in no way inferior to the conventional one in performance.

The above objects are attained by a piezoelectric vibrator mounting system for a nebulizer comprising an insulating support; an annular projected vibrator support integrally formed with the insulating support; a piezoelectric vibrator including a plurality of electrodes and located on the insulating support; and an elastic annular holder having an essentially L-shaped cross section for holding down the periphery of the piezoelectric vibrator, said elastic annular holder being fitted to the insulating support, the distal end surface of the vibrator support being inclined, a plurality of connecting electrode members being mounted on the vibrator support and each of the connecting electrode members being pressed against the corresponding electrodes of the piezoelectric vibrator.

DESCRIPTION OF PREFERRED EMBODIMENTS

The embodiments of a piezoelectric vibrator mounting system for a nebulizer according to the present invention will be described while referring to the accompanying drawings.

Figure 1:
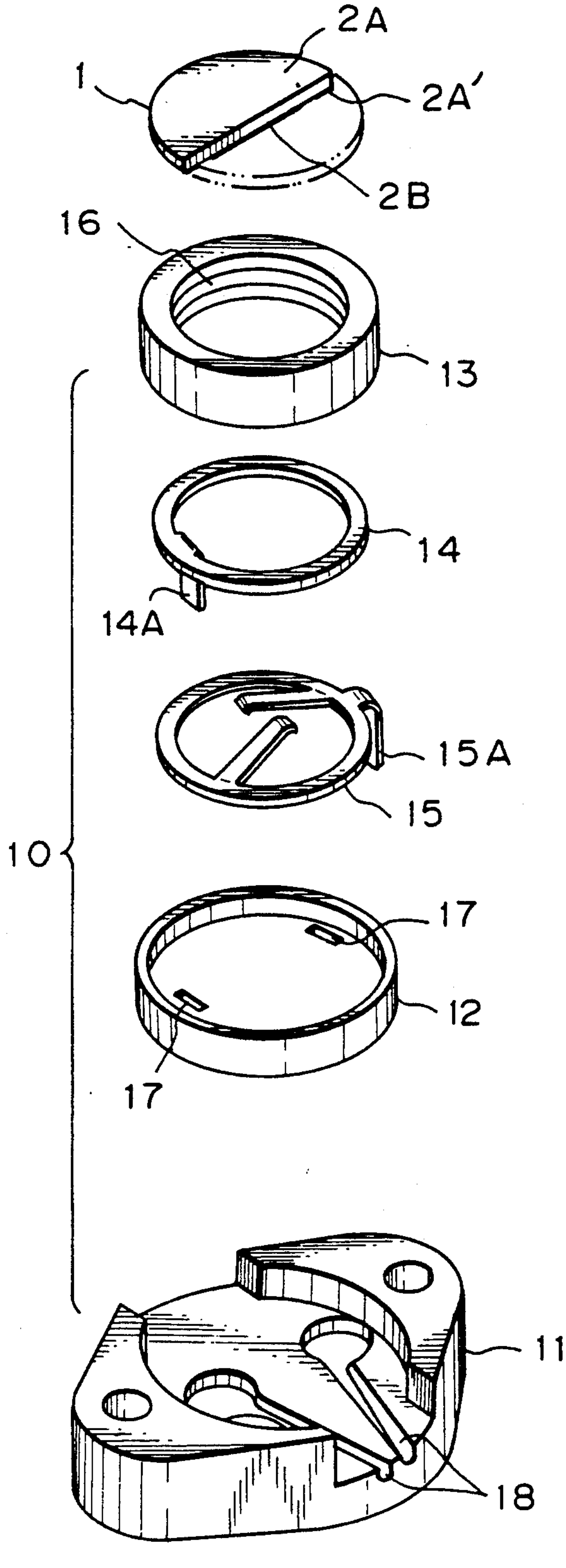
FIG. 1 is a perspective exploded view of a conventional piezoelectric vibrator mounting system.
Figure 2:
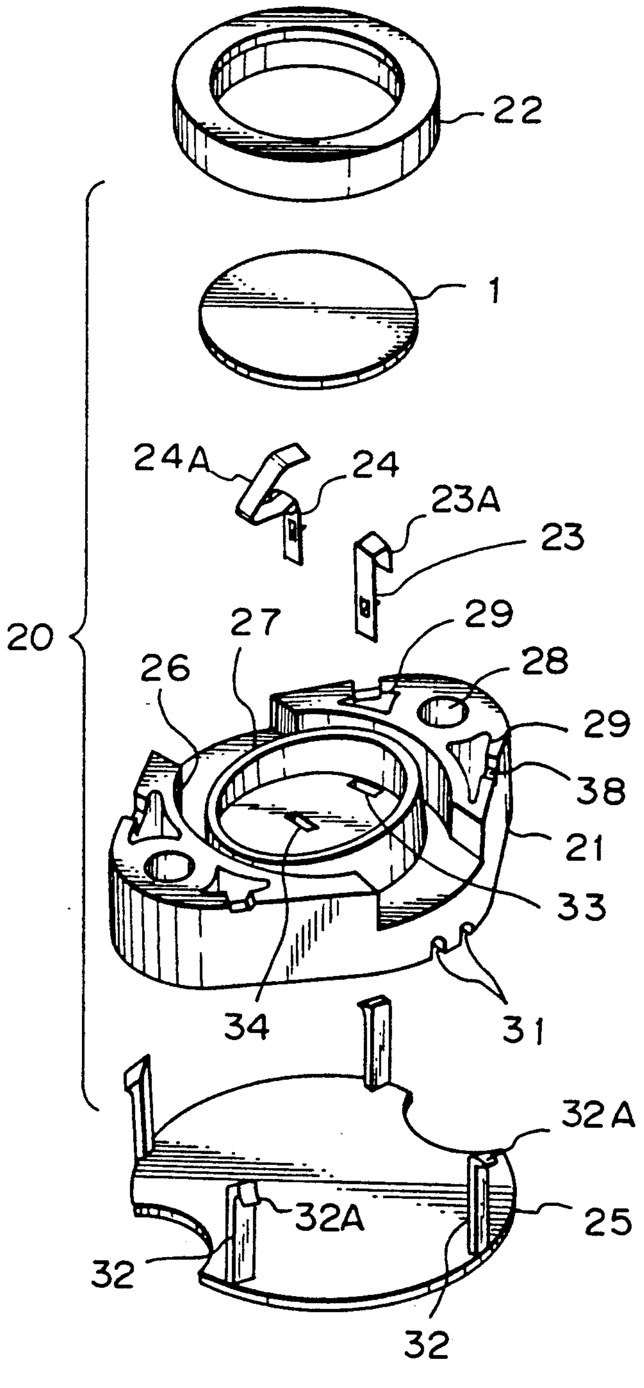
FIG. 2 is a perspective exploded view showing the first embodiment of a piezoelectric vibrator mounting system for a nebulizer according to the present invention.

The first embodiment of the present invention is shown in FIGS. 2∼4. In FIGS. 2∼4, a piezoelectric vibrator mounting system 20 comprises a support 21 made of an insulating resin, an elastic annular holder 22 made of a rubber or the like and having an essentially L-shaped cross section (see FIG. 3), a connecting electrode member 23 for contact with the marginal electrode 2A' of a piezoelectric vibrator 1 for generating a ultrasonic wave, a connecting electrode member 24 for contact with a counter electrode 2B, and, a rear lid 25 made of an insulating resin.

Figure 3:
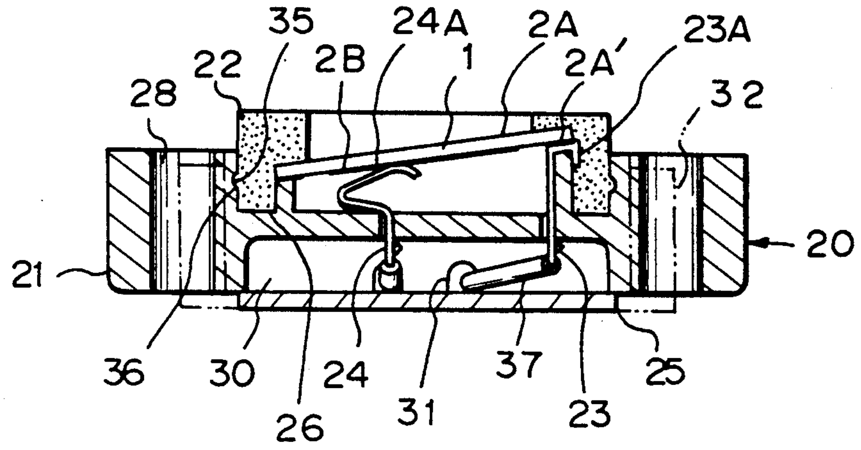
FIG. 3 is a sectional view of the structure of FIG. 2.
Figure 4:
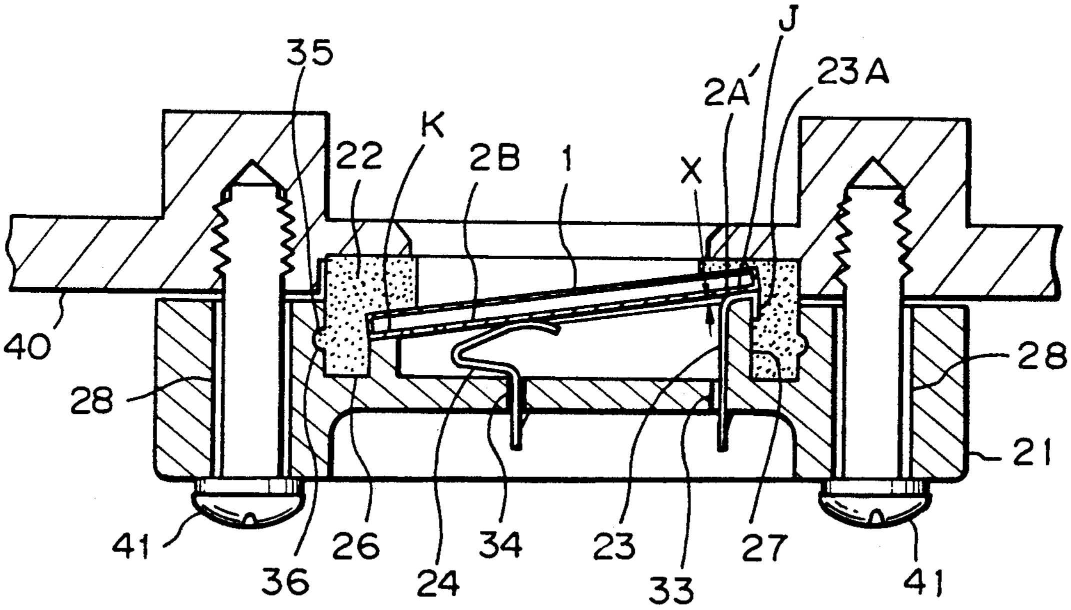
FIG. 4 is a sectional view of the first embodiment of the piezoelectric vibrator mounting system for a nebulizer shown in FIG. 2 as it is mounted onto the bottom of an atomizing chamber or the base of an atomizing unit.

The support 21 has a ring-shaped recess 26 for fitting the circumferential surface of the elastic annular holder 22 therein. An annular projected vibrator support 27 rising from the bottom of the ring-shaped recess 26 is integrally formed with the support 21. The vibrator support 27 has a size capable of supporting the periphery of the piezoelectric vibrator 1. The distal end surface of the vibrator support 27 for supporting the piezoelectric vibrator 1 is inclined relative to the bottom surface of the recess 26. It is easy to atomize a liquid, so that the piezoelectric vibrator 1 is inclined for the horizontal level. Mounting holes 28 and rear lid mounting holes 29 are formed on both end portions of the support 21. As shown in FIG. 3, another recess 30 and lead wire lead-out grooves 31 are formed on the bottom surface side of the support 21. The support 21 can be fixed to the base 40 of the bottom of an atomizing chamber or an atomizing unit by screws 41 by utilizing the mounting holes 28 as shown in FIG. 4.

The height of the inner surroundings of the elastic annular holder 22 varies grandually along the inclination of the distal end surface of the vibrator support 27. The height is suited to the value which is added to the height of the vibrator support 27 to the thickness of the piezoelectric vibrator 1 and the hook-shaped portion 23A.

The elastic annular holder 22 with the essentially L-shaped cross section holds the piezoelectric vibrator 1 while keeping its watertightness.

The connecting electrode member 23 is formed with a hook-shaped portion 23A by a metal plate on the upper portion of a tongue-like portion for engaging with the vibrator support 27. The connecting electrode member 24 is formed with a U-shaped or V-shaped elastic bend 24A by a metal plate on the upper portion of a tongue-like portion.

The rear lid 25 has four mounting legs 32 integrally formed therewith for being freely inserted in the four back lid mounting holes 29 of the support 21. Hooks 32A are formed on the distal ends of the legs 32.

After the tongue-like portions of the connecting electrode members 23 and 24 are inserted into the slit-like openings 33 and 34, respectively, and the hook-shaped portion 23A of the connecting electrode member 23 is hooked to the annular support 27, the piezoelectric vibrator 1 is located on the support 27 and the elastic annular holder 22 with the essentially L-shaped cross section is put on the piezoelectric vibrator 1 so as to hold down the periphery thereof and the circumferential surface of the elastic annular holder 22 is fitted into the recess 26 of the support 21. A strip projection 35 on the circumferential surface of the elastic annular holder 22 is fitted into an annular groove 36 formed in the inner circumferential surface of the recess 26 as shown in FIG. 3 so that the elastic annular holder 22 is prevented from being disengaged.

When the vibrator is located, the upper end portions of the connecting electrode members 23 and 24 are pressed against the marginal electrode 2A' of the vibrator 1 and the counter electrode 2B, respectively.

After the lead wires 37 are connected to the lower ends of the tongue-like portions of the connecting electrode members 23 and 24 by soldering on the rear surface of the support 21 and the lead wires 37 are led out from the lead wire lead-out grooves 31, the rear lid 25 is fitted to the bottom of the support 21. That is, the mounting legs 32 of the rear lid 25 are inserted into the rear lid mounting holes 29 from the rear side of the support 21, and the hooks 32A of the legs 32 are engaged with engaging grooves 38 in the upper openings 29 of the mounting holes 29 whereby the rear lid 25 is fixedly attached to the support 21.

As shown in FIG. 4, after the assembling of the piezoelectric vibrator mounting system 20 is completed, the support 21 is fixed to the bottom of the atomizing chamber or the base 40 of the atomizing unit by the screws 41 by utilizing the mounting holes 28 of the support 21. At this time, the elastic annular holder 22 is pressed against the bottom surface of the base 40 to secure its watertightness.

Although shown on the front side of the support 21 in FIG. 2, the lead wire lead-out grooves 31 are formed also on the back side of the support 21, and the lead wires 37 can be led out on either the front side or the back side in accordance with the kind of the instrument of a user.

The following effects can be obtained by the structure of the above-described first embodiment:

(1) Since the elastic annular support 22 has the essentially L-shaped section, the entire subassemblies, the electrode members 23 and 24, the piezoelectric vibrator 1 and the elastic annular holder 22 can be sequentially assembled to the insulating support 21 from above and therefore the assembly can be further automated and mechanized.

(2) Since the electrode members 23 and 24 have no annular structure, no loss is produced in materials and therefore material costs are reduced.

(3) Since the insulating support 21 is symmetrical except in the direction of the inclination of the vibrator support 27, and moreover the lead wires 37 can be led out on any of the front and back sides, the direction of the inclination of the piezoelectric vibrator 1 can be changed by 180° by rotating the support 21 through 180°, and the inclination of the vibrator 1 can take two directions by using a single support 21. Accordingly, when two supports 21 having the vibrator supports 27 with the directions of the inclination different from each other by 90° are prepared, the atomizing unit having four different kinds of directions for the inclination of the vibrator 1 can be realized by two kinds of the supports 21.

By the way, when a connecting electrode member was mounted on an piezoelectric vibrator support, the cracking and the change of characteristics are caused by adding unbalanced power to the piezoelectric vibrator 1. The object of the second embodiment of the present invention is to prevent the cracking and the change of characteristics.

Figure 5:
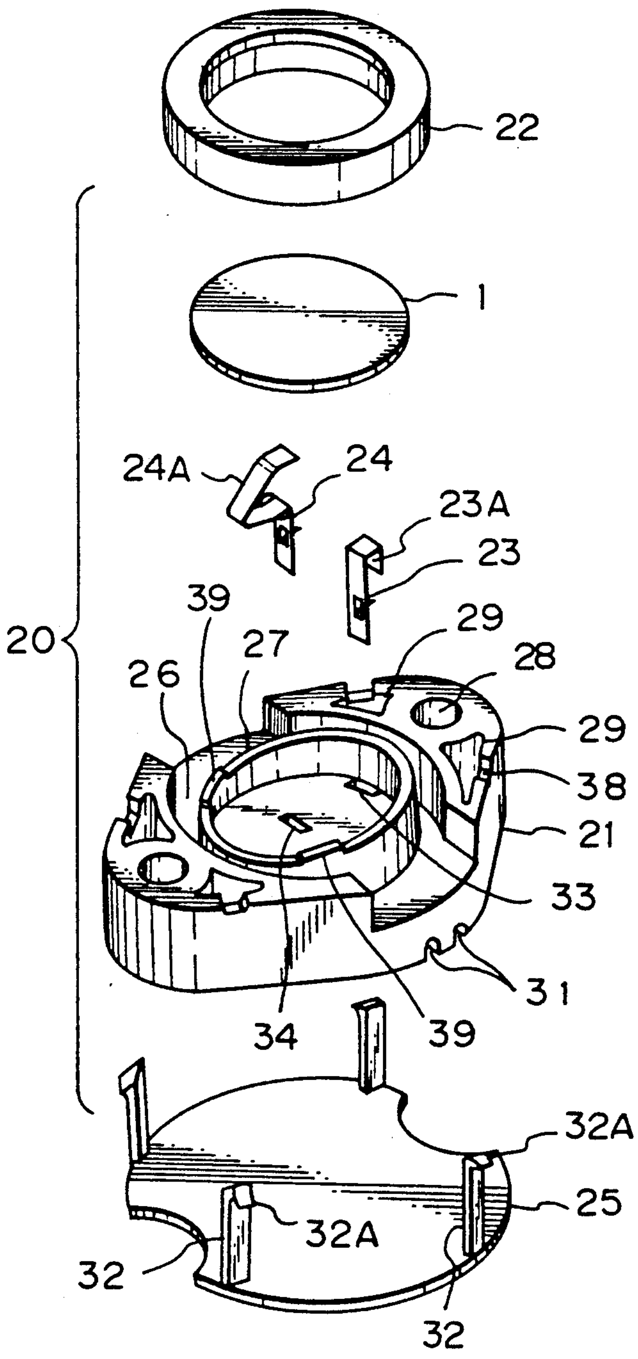
FIG. 5 is a perspective exploded view showing the second embodiment of a piezoelectric vibrator mounting system for a nebulizer according to the present invention.
Figure 6:
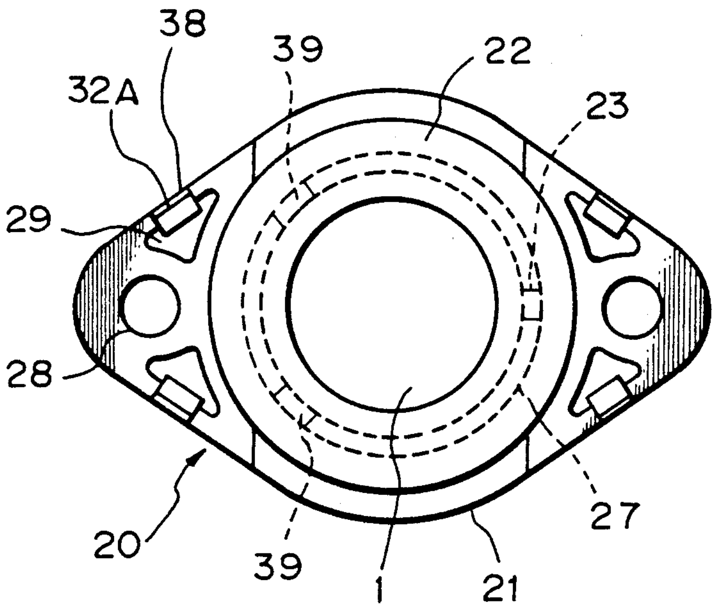
FIG. 6 is a plan view of FIG. 5.

The second embodiment of the present invention is shown in FIG. 5 and FIG. 6. In structural members being different from the first embodiment, the plural projection members 39 for making the height according to the height suitable for the thickness of the said connecting electrode member 23 on the vibrator support 27 are formed in some positions. As shown in FIG. 6, it is desirable that those projection members 39 and the connecting electrode member 23 are mounted on the positions near the vertex of a regular triangle or a regular polygon. A concentric of a regular triangle or a regular polygon is equal to the center of the vibrator support 27. Therefore, it is able to uniformly support the piezoelectric vibrator 1.

When the vibrator is located, the vibrator 1 is uniformly supported by the plural projected members 39 on the vibrator support 27 and the connecting electrode member 23, as the result, the upper end portions of the connecting electrode members 23 are pressed against the marginal electrode 2A' of the vibrator 1 and the counter electrode 2B, respectively.

The following effect can be obtained by the structure of above-described second embodiment in addition to the effects of the first embodiment:

(4) Since the projected members 39 for making the height are formed on the vibrator support 27 of the annular projected surface, when it is used the inexpensive connecting electrodes 23,24 which can be made by bending a band-shaped elastic metal plate, the piezoelectric vibrator 1 can be supported uniformly and can prevent the cracking and the variation from the desired characteristics.

By the way, as the thickness of the connecting electrode 23 on the vibrator support of the order of 0.2 mm, a gap of the dimension X in FIG. 4 results between the distal end surface of the vibrator support 27 of the annular projection and the upper surface of the piezoelectric vibrator 1. The piezoelectric vibrator 1 is supported in two positions. One is position J of the connecting electrode 23. The other is position K of the opposition surface of the upper surface of the support. When the support 21 is fixed to the base 40 of the bottom of an atomizing chamber or an atomizing unit with screws 41 by utilizing the mounting holes 28, and is pressed against the elastic annular holder 22 of the piezoelectric vibrator 1 for keeping its watertightness, the unbalanced power adds to the piezoelectric vibrator 1. As the result, the piezoelectric vibrator 1 can cause cracking and the vibrational characteristic of the piezoelectric vibrator largely varies.

Figure 7:
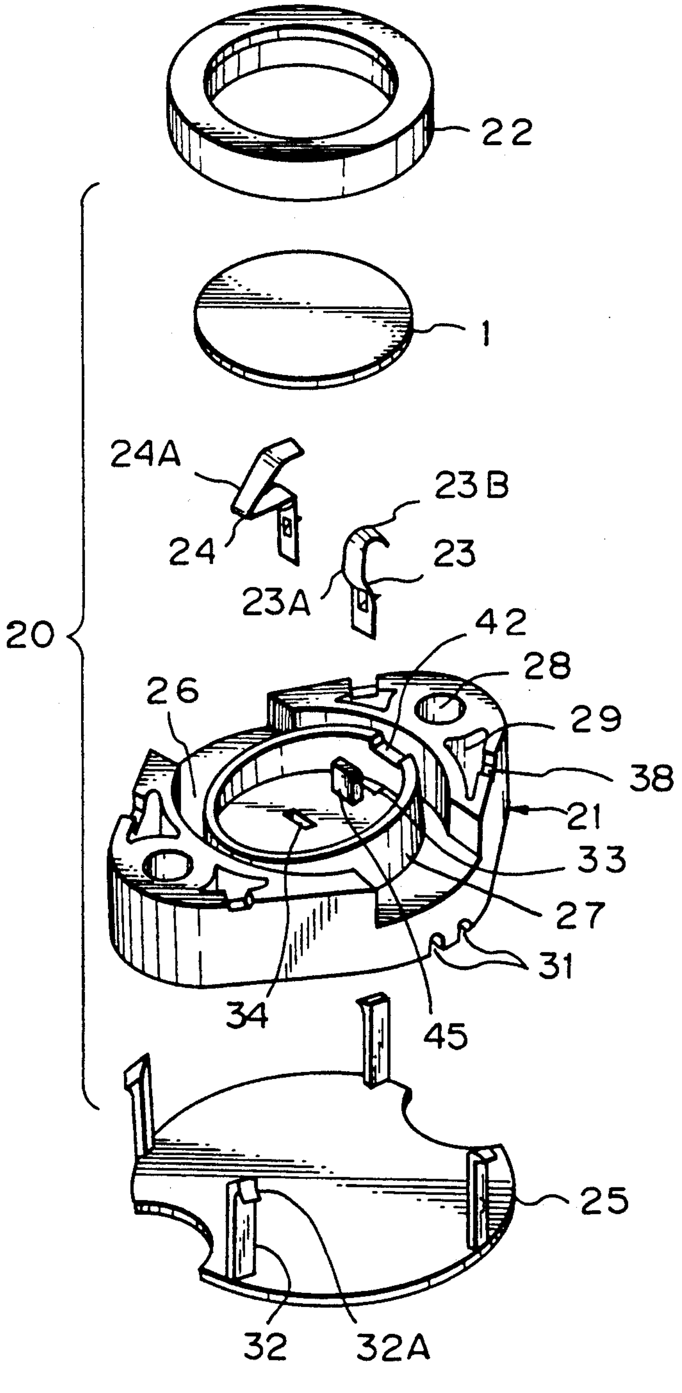
FIG. 7 is a perspective exploded view showing the third embodiment of a piezoelectric vibrator mounting system for a nebulizer according to the present invention.
Figure 8:
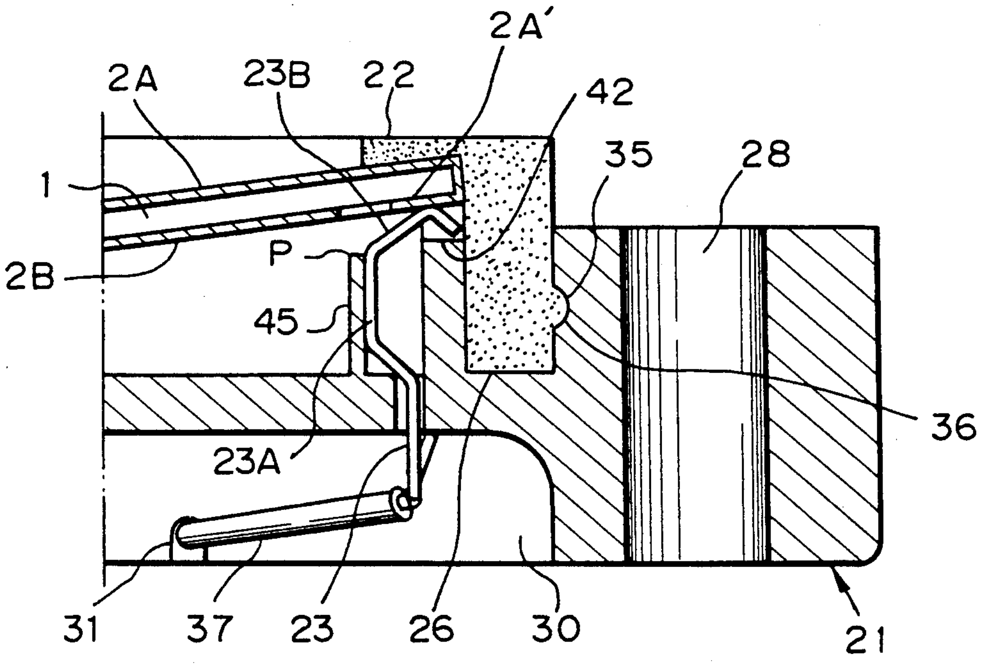
FIG. 8 is an elevationally enlarged vertical section of FIG. 7.

To solve the above-problem, the third embodiment shown in FIG. 7 and FIG. 8 have structral members being different from the first embodiment. A recess 42 having a step down surface for positioning the end surface of the connecting electrode 23 is formed on the distal end surface of the said vibrator support 27. A backrest member 45 for supporting a middle portion 23A of the connecting electrode member 23 is in the support 21.

The connecting electrode member 23 is formed with the middle portion 23A by a metal plate on the upper portion of the tongue-like portion for engaging the backrest member 45, and with the elastic member 23B above the middle portion 23A by a metal plate for pressing against the marginal electrode 2A' of the vibrator. The end portion of the elastic member 23B is curved for making the upper projected face. The elastic member 23B makes contact with the marginal electrode 2A' by using a position P in FIG. 8 for a fulcrum wherein it presses to against the backrest member 45.

After the tongue-like portions of the connecting electrode members 23 and 24 are inserted into the slit-like openings 33 and 34, respectively, and the end portion of the elastic member is located on the recess 42 of the annular support 27, the piezoelectric vibrator 1 is located on the support 27. Then, the elastic annular holder 22 with the essentially L-shaped section is put on the piezoelectric vibrator 1 so as to hold down the periphery thereof, and the circumferential surface of the elastic annular holder 22 is fitted into the recess 26 of the support 21. The strip projection 35 on the circumferential surface of the annular holder 22 is fitted into the annular groove 36 formed in the inner circumferential surface of the recess 26 as shown in a section in FIG. 8 whereby the elastic annular holder 22 is prevented from being disengaged.

When the vibrator is located, the vibrator 1 is supported uniformly, there is no space in the end surface of the vibrator support 27, and the upper end portions of the connecting electrode members 23 and 24 are pressed against the marginal electrde 2A' of the vibrator and the counter electrode 2B, respectively.

The following effect can be obtained by the structure of above-described third embodiment in addition to the effects of first and second embodiments.

(5) Since the groove member 42 having a step down surface is formed in the distal end surface of the vibrator support 27 of the annular projected members, and the end portion of the connecting electrode 23 is located on said groove 42, uniformly, there is no space between the piezoelectric vibrator support 1 and the support, the piezoelectric vibrator 1 can be supported uniformly and it can prevent the cracking and the variation of the vibrational characteristic.

Figure 9:
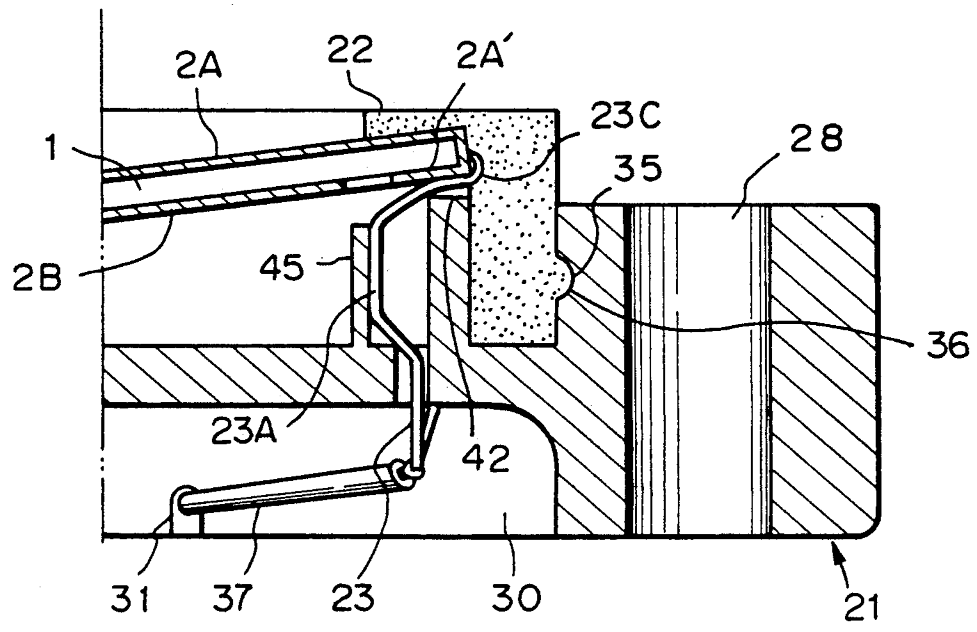
FIG. 9 is an elevationally enlarged vertical section showing the fourth embodiment of a piezoelectric vibrator mounting system for a nebulizer.

The fourth embodiment of present invention is shown in FIG. 9. The end portion of an elastic member 23C formed in the connecting electrode 23 crook to making the upper recess face. The end portion of an elastic member 23C is pressed against the distal end surface of marginal electrode 2A' of the vibrator 1.

Figure 10:
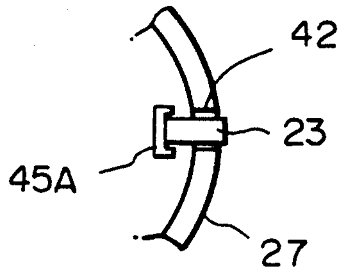
FIG. 10 is a fragmentary plan view showing a backrest member.

Although the backrest member 45 is a mere plate set upright from the bottom of the support 21 in the third and fourth embodiments, the backrest member 45 is preferred to have a U-shaped cross section as shown in FIG. 10. There is an advantage that it can prevent the improper positioning of the connecting electrode member 23 by engaging with the middle of the connecting electrode member 23 in the U-shaped cross section of the backrest 45.

It should be realized that the structures of the details of the insulating support, the electrode members, the rear lid and the like can be suitably changed within the spirit and scope of the invention.

What is claimed is:

1. A piezoelectric vibrator mounting system for a nebulizer comprising (20):

an insulating support (21);

an annular projected vibrator support (27) integrally formed with the insulating support (21);

a piezoelectric vibrator (1) including a plurality of electrodes (23, 24) and located on the insulating support (21); and an elastic annular holder (22) having an essentially L-shaped cross section for holding down the periphery of the piezoelectric vibrator (1), said elastic annular holder (22) being fitted to the insulating support (21), a plurality of connecting electrode members (23, 24) being mounted on the vibrator support (27) and each of the connecting electrode members (23, 24) being pressed against the corresponding electrodes (2B, 2A) of the piezoelectric vibrator (1);

the distal end surface of the vibrator support (27) being inclined so that the vibrator (1) is inclined.

2. A piezoelectric vibrator mounting system for a nebulizer according to claim 1, wherein a rear lid (25) is fitted to the bottom surface of the insulating support (21).

3. A piezoelectric vibrator mounting system for a nebulizer according to claim 1, wherein a plurality of projected members (39) for making the height according to the height suitable to the thickness of the connecting electrode member (23) are formed in plural positions on the distal end surface of the vibrator support (27).

4. A piezoelectric vibrator mounting system for a nebulizer according to claim 3, wherein the projected members (39) and the connecting electrode member (23) are mounted so that a center of gravity of a regular polygon constituted by said projected members (39) coincides with a center of a circle which includes said projected members (39) so that the angular spacing of projected members (39) and the connecting electrode member (23) is uniform.

5. A piezoelectric vibrator mounting system for a nebulizer according to claim 1, wherein a recess (42) for positioning the end surface of the connecting electrode member (23) pressed against one of the connecting electrode members (23, 24) of the piezoelectric vibrator (1) is formed on the end surface of the vibrator support (27), so that both of the end surface of the vibrator support (27) and the end surface of the connecting electrode member (23) are formed on an equal surface.

6. A piezoelectric vibrator mounting system for a nebulizer according to claim 5, wherein a backrest member (45) for supporting a middle portion of the connecting electrode member (23) is formed in the insulating support (21).

7. A piezoelectric vibrator mounting system for a nebulizer according to claim 5, wherein the end portion of an elastic member is in L-shaped (23C) so that the connecting electrode (23) is connected to the electrode (2A') of the vibrator (1) at both a rear surface and a side surface.

8. A piezoelectric vibrator mounting system for a nebulizer according to claim 6, wherein the backrest member (45) has a U-shaped cross section.

* * * * *